United States Patent
Shimada et al.

(10) Patent No.: US 8,076,256 B2
(45) Date of Patent: Dec. 13, 2011

(54) SEMICONDUCTOR CERAMIC COMPOSITION AND METHOD FOR PRODUCING THE SAME

(75) Inventors: Takeshi Shimada, Saitama (JP); Kazuya Toji, Osaka (JP)

(73) Assignee: Hitatchi Metals, Ltd., Tokyo (JP)

(*) Notice: Subject to any disclaimer, the term of this patent is extended or adjusted under 35 U.S.C. 154(b) by 294 days.

(21) Appl. No.: 12/445,198

(22) PCT Filed: Oct. 26, 2007

(86) PCT No.: PCT/JP2007/070960
§ 371 (c)(1),
(2), (4) Date: Apr. 10, 2009

(87) PCT Pub. No.: WO2008/050877
PCT Pub. Date: May 2, 2008

(65) Prior Publication Data
US 2010/0075824 A1    Mar. 25, 2010

(30) Foreign Application Priority Data

Oct. 27, 2006 (JP) .............................. P. 2006-293366
Nov. 1, 2006 (JP) .............................. P. 2006-298306

(51) Int. Cl.
C04B 35/00 (2006.01)
C04B 35/14 (2006.01)
C04B 35/16 (2006.01)
(52) U.S. Cl. .................... 501/138; 501/137; 501/139
(58) Field of Classification Search .............. 501/134, 501/135, 136, 137, 138, 139
See application file for complete search history.

(56) References Cited

U.S. PATENT DOCUMENTS

| 7,700,509 B2* | 4/2010 | Shimada et al. ............. 501/137 |
| 2009/0036293 A1* | 2/2009 | Shimada et al. ............. 501/137 |

FOREIGN PATENT DOCUMENTS

| JP | 56-169301 | 12/1981 |
| JP | 56169301 A * | 12/1981 |
| JP | H11-180769 A * | 7/1999 |
| JP | 2005255493 A * | 9/2005 |
| WO | WO 2006/106910 | 10/2006 |

OTHER PUBLICATIONS

Huo et al. Effects of Bi1/2Na1/2TiO3 on Curie temperature and the PTC effects of BaTO3-based positive temperature coefficient ceramics. Sensors and Actuators A, Feb. 20, 2006, 128 (2006) 265-269.*
Huo et al., "Effects of $Bi_{1/2}Na_{1/2}TiO_3$ on the Curie temperature and the PTC effects of $BaTiO_3$-based positive temperature coefficient ceramics," *Sensors and Actuators A*, vol. 128 (2006), pp. 265-269.

* cited by examiner

*Primary Examiner* — Jerry Lorengo
*Assistant Examiner* — Noah Wiese
(74) *Attorney, Agent, or Firm* — Stein McEwen, LLP

(57) ABSTRACT

It is intended to provide a Pb-free semiconductor ceramic composition capable of shifting its Curie temperature toward a positive direction and capable of enhancing its jump characteristic while minimizing the increase in the resistivity at room temperature. There is provided a semiconductor ceramic composition in which a part of Ba of $BaTiO_3$ is substituted with Bi—Na, the semiconductor ceramic composition being obtained by sintering a mixed calcined powder containing a calcined BT powder containing a calcined powder of $(BaR)TiO_3$ or a calcined powder of $Ba(TiM)O_3$ (in which R and M each are a semiconductor dopant), and a calcined BNT powder containing a calcined powder of $(BiNa)TiO_3$; in which $BaCO_3$ and/or $TiO_2$ is/are added to the calcined BT powder or the calcined BNT powder or to the mixed calcined powder.

6 Claims, 1 Drawing Sheet

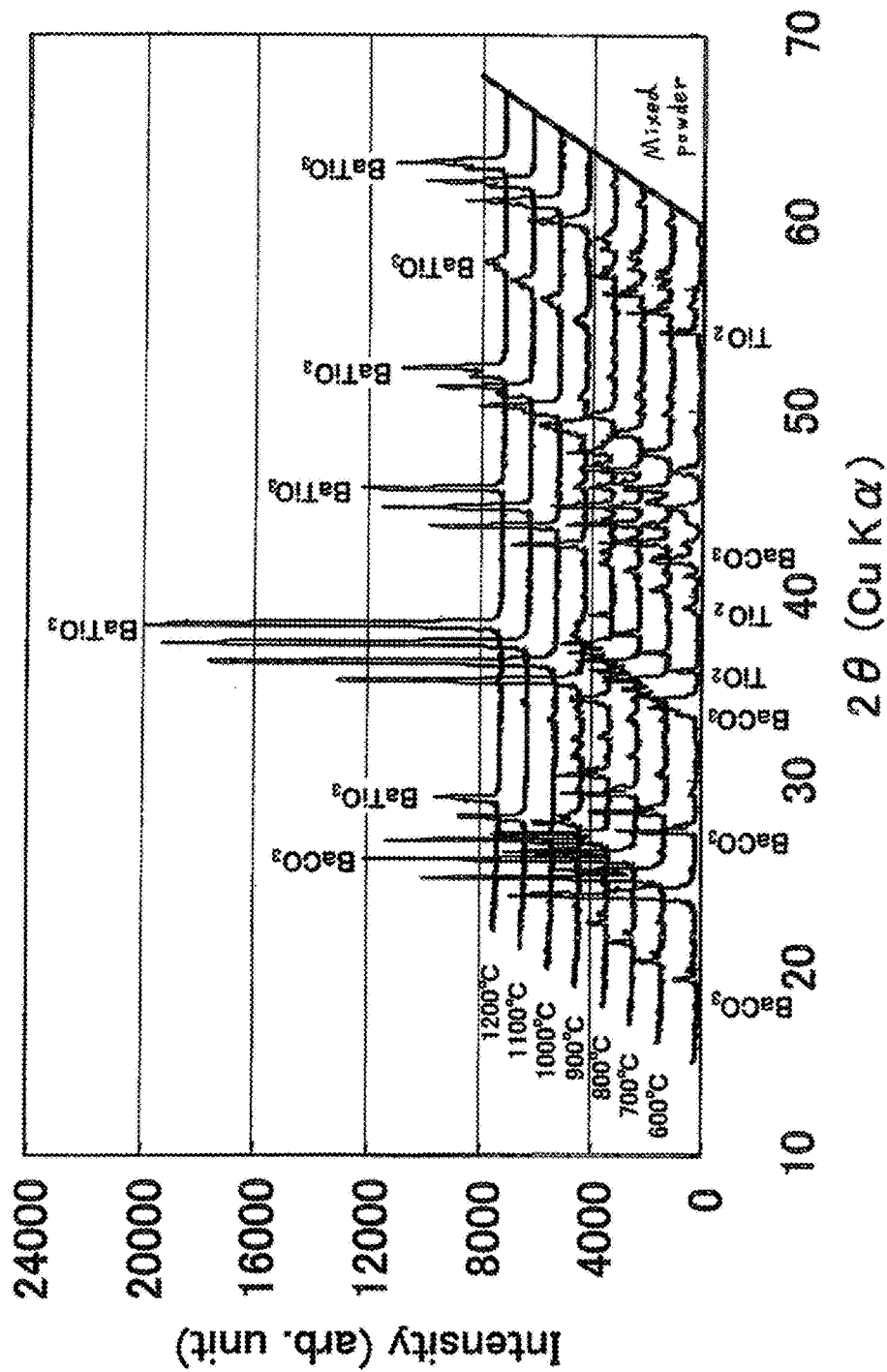

SEMICONDUCTOR CERAMIC COMPOSITION AND METHOD FOR PRODUCING THE SAME

CROSS-REFERENCE TO RELATED APPLICATIONS

This application claims the benefit of PCT International Patent Application No. PCT/JP2007070960, filed Oct. 26, 2007, Japanese Patent Application No. 2006-298306, filed Nov. 1, 2006, and Japanese Patent Application No. 2006-293366, filed Oct. 27, 2006, in the Japanese Patent Office, the disclosures of which are incorporated herein by reference.

BACKGROUND OF THE INVENTION

1. Field of the Invention

The present invention relates to a semiconductor ceramic composition having a positive resistive temperature, which is used for a PTC thermistor, a PTC heater, a PTC switch, a temperature detector and the like.

2. Description of the Related Art

As materials showing a PTCR characteristic (Positive Temperature Coefficient of Resistivity), compositions in which various semiconductor dopants are added to $BaTiO_3$ have been conventionally proposed. These compositions have a Curie temperature around 120° C. Depending upon the use, it becomes necessary for these compositions to shift the Curie temperature thereof.

It has been proposed to shift the Curie temperature by adding, for example, $SrTiO_3$ to $BaTiO_3$. However, the Curie temperature shifts only to a negative direction and does not shift to a positive direction in this case. Currently, only $PbTiO_3$ is known as an additive material for shifting the Curie temperature to a positive direction. However, since $PbTiO_3$ contains an element that causes environmental pollution, a material using no $PbTiO_3$ has been demanded in recent years.

Regarding $BaTiO_3$ semiconductor ceramics, there is proposed a method for producing a $BaTiO_3$ semiconductor ceramic by adding one or more of Nb, Ta and rare earth elements to a composition having a structure of $Ba_{1-2x}(BiNa)_x TiO_3$, wherein a part of Ba in $BaTiO_3$ in which no $PbTiO_3$ is used is substituted with Bi—Na and x is controlled to be in a range of $0<x\leq0.15$, sintering the composition in nitrogen, and then subjecting the composition to a heat treatment in an oxidizing atmosphere, for the purpose of preventing the reduction in the temperature coefficient of resistance due to Pb substitution and for the purpose of reducing the voltage dependence to thereby enhance the producibility and the reliability of the semiconductor ceramic (see, Patent Document 1).

Patent Document 1: JP-A-56-169301

SUMMARY OF THE INVENTION

One significant characteristic of PTC materials is that the resistivity of a PTC material suddenly rises at the Curie point (jump characteristic=temperature coefficient of resistance α), and this is considered because the resistance (resistance by Schottky barrier) formed in the grain boundary may increase. Regarding their properties, PTC materials are required to have a high jump characteristic of the resistivity.

Patent Document 1 discloses in Examples a composition in which 0.1 mol % of $Nd_2O_3$ is added thereto as a semiconductor dopant; however, in valence control of the composition, when a trivalent cation is added thereto as a semiconductor dopant, then the effect of the semiconductor dopant is lowered due to the presence of the monovalent Na ion therein. As a result, there occurs a problem in that the resistivity at room temperature increases.

To that effect, Pb-free PTC materials as in Patent Document 1 have an excellent jump characteristic but has a high resistivity at room temperature; while those having a poor jump characteristic tend to have a too much lowered resistivity at room temperature. Accordingly, there is a problem in that Pb-free PTC materials could not satisfy both a stable resistivity at room temperature and an excellent jump characteristic. In addition, those having a poor jump characteristic has another problem in that when a current is applied to the material, its temperature fluctuation at around Curie point increases and the temperature at which the material is stable is higher than the Curie point.

For retarding the stable temperature fluctuation and for easy material planning, the jump characteristic of the material must be improved, for which the increase in the resistivity at room temperature in some degree may be taken into consideration; however, it is extremely difficult to satisfy both the requirement that the high jump characteristic is kept as such and the requirement that the resistivity at room temperature is prevented from increasing; and in ordinary cases, the resistivity at room temperature increases too much over the range acceptable for practical use.

Patent Document 1 discloses in Examples, mixing, before calcination thereof, all the constituents such as the starting materials including $BaCO_3$, $TiO_2$, $Bi_2O_3$, $Na_2O_3$ and PbO, followed by calcining, forming, sintering and heat-treating. However, in the composition where a part of Ba of $BaTiO_3$ is substituted with Bi—Na, when all the constituents are mixed before calcination thereof, then Bi may evaporate during the calcination step to cause compositional deviation in Bi—Na, whereby the formation of different phases is accelerated, and increase in the resistivity at room temperature and fluctuation of the Curie temperature may be caused.

It may be considered to perform calcination at a low temperature for restraining the evaporation of Bi. However, although the evaporation of Bi is certainly restrained by this method, a complete solid solution cannot be formed and the desired characteristics cannot be obtained.

An object of the invention is to provide a semiconductor ceramic composition containing no Pb, which is capable of shifting the Curie temperate to a positive direction and of enhancing the jump characteristic while minimizing the increase in the resistivity at room temperature.

Further, it is another object of the invention to provide a semiconductor ceramic composition in which a part of Ba in $BaTiO_3$ is substituted with Bi—Na, which is capable of restraining the evaporation of Bi in the calcination step, is capable of restraining the compositional deviation of Bi—Na thereby suppressing the formation of different phases, is capable of further reducing the resistivity at room temperature, and is capable of restraining the fluctuation of the Curie temperature; and to provide a production method of the same.

As a result of intensive studies for attaining the above objects, the inventors have found that, in producing a semiconductor ceramic composition in which a part of Ba in $BaTiO_3$ is substituted with Bi—Na, when a calcined powder of $(BaR)TiO_3$ or a calcined powder of $Ba(TiM)0_3$ (hereinafter these calcined powders are referred to as "calcined BT powder"), and a calcined powder of $(BiNa)TiO_3$ (hereinafter referred to as "calcined BNT powder") are separately prepared and the calcined BT powder and the calcined BNT powder each are calcined at a suitable temperature for each of them, then the evaporation of Bi from the calcined BNT powder may be retarded and the compositional deviation of Bi—Na may be thereby suppressed to inhibit the formation of different phases; and when these calcined powders are mixed, formed and sintered, then a semiconductor ceramic composition which has a low resistivity at room temperature and is capable of restraining the fluctuation of the Curie temperature can be obtained.

In addition, the inventors have found that, when $BaCO_3$ and/or $TiO_2$ is added to the above calcined BT powder or calcined BNT powder or to the mixed calcined powder of the two, then the level of Schottky barrier formation increases, and with the increase in the level of Schottky barrier, the jump characteristic of the semiconductor ceramic composition can be enhanced while minimizing the increase in the resistivity at room temperature, thereby completing the invention.

The invention provides a semiconductor ceramic composition in which a part of Ba of $BaTiO_3$ is substituted with Bi—Na, the semiconductor ceramic composition being obtained by sintering a mixed calcined powder comprising a calcined BT powder comprising a calcined powder of $(BaR)TiO_3$ or a calcined powder of $Ba(TiM)O_3$ (wherein R and M each are a semiconductor dopant), and a calcined BNT powder comprising a calcined powder of $(BiNa)TiO_3$; wherein $BaCO_3$ and/or $TiO_2$ is/are added to the calcined BT powder or the calcined BNT powder or to the mixed calcined powder.

The invention proposes, in the semiconductor ceramic composition of the above-mentioned constitution:

a constitution in which an amount of $BaCO_3$ and/or $TiO_2$ to be added is such that the amount of $BaCO_3$ is at most 30 mol % and the amount $TiO_2$ is at most 30 mol % when the total amount of the calcined BT powder and $BaCO_3$ and/or $TiO_2$ is taken as 100 mol %;

a constitution in which, when the semiconductor dopant R is at least one rare earth element and the calcined powder of $(BaR)TiO_3$ is used as the calcined BT powder, the semiconductor ceramic composition is represented by a composition formula: $[(BiNa)_x(Ba_{1-y}R_y)_{1-x}]TiO_3$ wherein x and y each satisfy $0<x\leq0.3$ and $0<y\leq0.02$; and a constitution in which, when the semiconductor dopant M is at least one of Nb and Sb and the calcined powder of $Ba(TiM)O_3$ is used as the calcined BT powder, the semiconductor ceramic composition is represented by a composition formula: $[(BiNa)_xBa_{1-x}][Ti_{1-z}M_z]O_3$ wherein x and z each satisfy $0<x\leq0.3$ and $0<z\leq0.005$.

The invention also provides a method for producing a semiconductor ceramic composition in which a part of Ba of $BaTiO_3$ is substituted with Bi—Na, the method comprising:

a step of preparing a calcined BT powder comprising a calcined powder of $(BaR)TiO_3$ or a calcined powder of $Ba(TiM)O_3$ (wherein R and M each are a semiconductor dopant), a step of preparing a calcined BNT powder comprising a calcined powder of $(BiNa)TiO_3$, a step of mixing the calcined BT powder and the calcined BNT powder to prepare a mixed calcined powder, and a step of forming and sintering the mixed calcined powder;

wherein $BaCO_3$ and/or $TiO_2$ is added to the calcined BT powder or the calcined BNT powder or to the mixed calcined powder.

The invention proposes, in the production method for a semiconductor ceramic composition of the above-mentioned constitution:

a constitution in which a calcination temperature in the step of preparing the calcined BT powder is not lower than 1000° C.;

a constitution in which a calcination temperature in the step of preparing the calcined BNT powder is from 700° C. to 950° C.;

a constitution in which an amount of $BaCO_3$ and/or $TiO_2$ to be added is such that the amount of $BaCO_3$ is at most 30 mol % and the amount $TiO_2$ is at most 30 mol % when the total amount of the calcined BT powder and $BaCO_3$ and/or $TiO_2$ is taken as 100 mol %;

a constitution in which 3.0 mol % or less of Si oxide and 4.0 mol % or less of Ca carbonate or Ca oxide are added before the calcination in the step of preparing the calcined BT powder or the step of preparing the calcined BNT powder or in both the two steps;

a constitution in which 3.0 mol % or less of Si oxide and 4.0 mol % or less of Ca carbonate or Ca oxide are added in the step of mixing the calcined BT powder and the calcined BNT powder to prepare the mixed calcined powder;

a constitution in which, when the semiconductor dopant R is at least one rare earth element and the calcined powder of $(BaR)TiO_3$ is used as the calcined BT powder, the semiconductor ceramic composition is represented by a composition formula: $[(BiNa)_x(Ba_{1-y}R_y)_{1-x}]TiO_3$ wherein x and y each satisfy $0<x\leq0.3$ and $0<y\leq0.02$; and a constitution in which, when the semiconductor dopant M is at least one of Nb and Sb and the calcined powder of $Ba(TiM)O_3$ is used as the calcined BT powder, the semiconductor ceramic composition is represented by a composition formula: $[(BiNa)_xBa_{1-x}][Ti_{1-z}M_z]O_3$ wherein x and z each satisfy $0<x\leq0.3$ and $0<z\leq0.005$.

According to the invention, there can be provided a Pb-free semiconductor ceramic composition capable of shifting the Curie temperature to a positive direction and capable of having a high jump characteristic while minimizing the increase in the resistivity at room temperature.

According to the invention, there can be provided a semiconductor ceramic composition capable of restraining the evaporation of Bi in the calcination step, capable of restraining the compositional deviation in Bi—Na to thereby inhibit the formation of different phases, capable of further reducing the resistivity at room temperature, and capable of restraining the fluctuation of the Curie temperature.

BRIEF DESCRIPTION OF THE DRAWING

These and/or other aspects and advantages of the invention will become apparent and more readily appreciated from the following description of the embodiments, taken in conjunction with the accompanying drawing of which:

FIG. 1 is a graph showing the X-ray diffraction patterns of a calcined powder of (BaLa)TiO3 in the invention at different calcination temperatures.

DETAILED DESCRIPTION OF THE EMBODIMENTS

The invention provides a semiconductor ceramic composition in which a part of Ba of $BaTiO_3$ is substituted with Bi—Na, the semiconductor ceramic composition being obtained by sintering a mixed calcined powder containing a calcined BT powder containing a calcined powder of $(BaR)TiO_3$ or a calcined powder of $Ba(TiM)O_3$ (in which R and M each are a semiconductor dopant), and a calcined BNT powder containing a calcined powder of $(BiNa)TiO_3$; in which $BaCO_3$ and/or $TiO_2$ is/are added to the calcined BT powder or the calcined BNT powder or to the mixed calcined powder.

The semiconductor ceramic composition of the invention may be any and every composition in which a part of Ba of BaTiO$_3$ is substituted with Bi—Na. When the composition formula is represented by [(BiNa)$_x$(Ba$_{1-y}$R$_y$)$_{1-x}$]TiO$_3$ (in which R is at least one rare earth element) in which x and y each are 0<x≦0.3 and 0<y≦0.02, or by [(BiNa)$_x$Ba$_{1-x}$][Ti$_{1-z}$M$_z$]O$_3$ (in which M is at least one of Nb and Sb) in which x and z each are 0<x≦0.3 and 0<z≦0.005, the composition may be free from Pb, may have an elevated Curie temperature, and may have an enhanced jump characteristic while minimizing the increase in the resistivity at room temperature.

In the above composition represented by [(BiNa)$_x$(Ba$_{1-y}$R$_y$)$_{1-x}$]TiO$_3$, x indicates the constituent range of (BiNa) and is preferably within a range of 0<x≦0.3. When x is 0, then the Curie temperature cannot be shifted toward a high temperature side; while when it is more than 0.3, the resistivity at room temperature may be near to 10$^4$ Ωcm and is unfavorable since the composition could hardly be applied to PTC heaters, etc.

R is at least one rare earth element and is most preferably La. In the composition formula, y indicates the constituent range of R and is preferably within a range of 0<y≦0.02. When y is 0, then the composition cannot be semiconductive; while when it more than 0.02, then the resistivity at room temperature may unfavorably increase. Changing the value y attains the valence control in the composition. In valence control in the composition where a part of Ba is substituted with Bi—Na, when a trivalent cation is added as a semiconductor dopant, then there may occur a problem in that the dopant effect may lower due to the presence of the monovalent Na ion and the evaporation of Bi and the resistivity at room temperature may increase. Accordingly, the more preferred range thereof is 0.002≦y≦0.02. The range 0.002≦y≦0.02 means from 0.2 mol % to 2.0 mol % in terms of mol % expression. In this connection, in Patent Reference 1 mentioned above, although 0.1 mol % of Nd$_2$O$_3$ is added as a semiconductor element, it is considered that semiconductor formation sufficient for use in PTC is not realized in that case.

In the composition represented by [(BiNa)$_x$Ba$_{1-x}$][Ti$_{1-z}$M$_z$]O$_3$, x indicates the constituent range of (BiNa) and is preferably within a range of 0<x≦0.3. When x is 0, then the Curie temperature cannot be shifted toward a high temperature side; while when it is more than 0.3, the resistivity at room temperature may be near to 10$^4$ Ωcm and is unfavorable since the composition could hardly be applied to PTC heaters, etc.

M is at least one of Nb and Sb, and preferably Nb. In the composition formula, z indicates the constituent range of M and is preferably within a range of 0<z≦0.005. When z is 0, then the valence control is impossible and the composition cannot be semiconductive; while when it is more than 0.005, then the resistivity at room temperature is unfavorably more than 10$^3$ Ωcm. The range 0<z≦0.005 means 0 to 0.5 mol % (not including 0 mol %) in terms of mol % expression.

In the above composition represented by [(BiNa)$_x$Ba$_{1-x}$][Ti$_{1-z}$M$_z$]O$_3$, Ti is substituted with an element M for valence control. In this case, the addition of the element M (the amount to be added, 0<z≦0.005) is for valency control at the tetravalent element, Ti site. Accordingly, in this case, the amount of the element M necessary for valency control may be smaller than the amount of the element R in the composition of [(BiNa)$_x$(Ba$_{1-y}$R$_y$)$_{1-x}$]TiO$_3$ where R is the semiconductor dopant (0.002≦y≦0.02). This is advantageous in that the internal strain of the semiconductor ceramic composition of the invention may be reduced.

In both of the above-mentioned compositions represented by [(BiNa)$_x$(Ba$_{1-y}$R$_y$)$_{1-x}$]TiO$_3$ and [(BiNa)$_x$Ba$_{1-x}$][Ti$_{1-z}$M$_z$]O$_3$, the ratio of Bi to Na is basically 1/1. The composition formula may be represented by [(Bi$_{0.5}$Na$_{0.5}$)$_x$(Ba$_{1-y}$R$_y$)$_{1-x}$]TiO$_3$ and [(Bi$_{0.5}$Na$_{0.5}$)$_x$Ba$_{1-x}$][Ti$_{1-z}$M$_z$]O$_3$. The ratio between Bi and Na in each of the compositions is basically set to 1/1 since the ratio between Bi and Na can be fluctuated due to evaporation of Bi in a calcination step, for example. That is to say, a case in which the ratio between Bi and Na in preparation is 1/1 but deviates from 1/1 in a sintered material is also included in the invention.

One example of a method for producing the semiconductor ceramic composition of the invention is described below.

According to the invention, in producing a semiconductor ceramic composition where a part of Ba of BaTiO$_3$ is substituted with Bi—Na, employed is a method including separately preparing a calcined BT powder containing a calcined powder of (BaR)TiO$_3$ or a calcined powder of Ba(TiM)O$_3$, and a calcined BNT powder containing a calcined powder of (BiNa)TiO$_3$, followed by calcining the BT powder and the BNT powder both at suitable temperatures for them (hereinafter this is referred to as a "separate calcination method").

By employing the above-described separate calcination method, Bi evaporation from the BNT calcined powder is suppressed, and it is possible to suppress generation of a secondary phase through prevention of a compositional shift of Bi—Na. Therefore, it is possible to obtain a semiconductor ceramic composition reduced in resistivity at a room temperature and suppressed in fluctuation in Curie temperature by mixing, forming, and sintering the calcined powders.

In the separate calcination method, the BT calcined powder is prepared by mixing BaCO$_3$, TiO$_2$, and a raw material powder of a semiconductive dopant such as La$_2$O$_3$ and Nb$_2$O$_5$ to prepare the mixed raw material powder, followed by sintering. The calcination temperature is preferably not lower than 1000° C. When the calcination temperature is lower than 1000° C., it is unfavorable since a complete single phase of (BaR)TiO$_3$ or Ba(TiM)O$_3$ cannot be formed. When a complete single phase is not formed, then unreacted BaCO$_3$ and TiO$_2$ may remain. This is because, in the invention, addition of a BaCO$_3$ powder and/or a TiO$_2$ powder is indispensable, but in such a case, it may be difficult to determine the amount of the powders. However, minor remainders of BaCO$_3$ and TiO$_2$ may be allowable. The calcination temperature is preferably from 1000° C. to 1300° C. The calcination time is preferably from 0.5 hours to 10 hours, more preferably from 2 to 6 hours.

In the step of preparing the calcined BNT powder in the separate calcination method, raw material powders Na$_2$CO$_3$, Bi$_2$O$_3$ and TiO$_2$ are first mixed to prepare a mixed raw material powder. In this step, when Bi$_2$O$_3$ is added too much (for example, in an mount of more than 5 mol %), then it is unfavorable since different phases may be formed during calcination and the resistivity at room temperature may increase.

Next, the mixed raw material powder is calcined. The calcination temperature is preferably within a range of from 700° C. to 950° C. The calcination time is preferably from 0.5 hours to 10 hours, more preferably from 2 hours to 6 hours. When the calcination temperature is lower than 700° C. or the calcination time is shorter than 0.5 hours, unreacted Na$_2$CO$_3$ or NaO formed through decomposition may react with water in the atmosphere or in the solvent in wet mixing to unfavorably cause compositional deviation or characteristic fluctuation. On the other hand, when the calcination temperature exceeds 950° C. or the calcination time is longer than 10 hours, then Bi may evaporate greatly to unfavorably cause compositional deviation and promote formation of different phases.

In the steps of preparing the above-mentioned respective calcined powders, the starting material powders may be crushed in mixing depending upon the grain sizes of the material powders. Mixing and crushing may be performed by any of wet mixing and crushing using pure water and ethanol, and dry mixing and crushing, but dry mixing and crushing is preferred for the reason of capable of restraining compositional deviation. Incidentally, $BaCO_3$, $Na_2CO_3$ and $TiO_2$ are exemplified as the starting materials in the above, but other Ba compounds, Na compounds and the like may also be used.

A main feature of the production method of the invention is adding $BaCO_3$ and/or $TiO_2$ to the calcined BT powder or the calcined BNT powder or to the mixed calcined powder of them. Accordingly, the advantage of the invention is that, in the semiconductor ceramic composition as finally obtained, where a part of Ba of $BaTiO_3$ is substituted with Bi—Na, the level of the Schottky barrier increases and with the increase in the level of the Schottky barrier therein, the jump characteristic of the composition is enhanced while minimizing the increase in the resistivity at room temperature.

Preferably, the amount of $BaCO_3$ and/or $TiO_2$ to be added is such that the amount of $BaCO_3$ is at most 30 mol % and the amount of $TiO_2$ is at most 30 mol % when the total of the calcined BT powder and $BaCO_3$ and/or $TiO_2$ is taken as 100 mol %. Changing the amount may control the resistivity at room temperature and the jump characteristic of the composition. In addition, since the amount can be controlled accurately, another advantage of the invention is that the reproducibility of the semiconductor ceramic composition is extremely good.

The content of $BaCO_3$ is at most 30 mol %. This is because, when the content thereof is more than 30 mol %, then other phases different from $BaCO_3$ may be formed and the resistivity at room temperature may thereby increase. In addition, this is unfavorable since $CO_2$ gas generates during the sintering step and the sintered body may be cracked. The content of $TiO_2$ is at most 30 mol %. This is because, when the content thereof is more than 30 mol %, then other phases different from $TiO_2$ may be formed and the resistivity at room temperature may thereby increase.

In case where the composition contains both $BaCO_3$ and $TiO_2$, the uppermost limit of their content is the total of 30 mol % of $BaCO_3$ and 30 mol % of $TiO_2$, namely 60 mol %, and the lowermost limit thereof may be more than 0 mol %. However, when the amount of $BaCO_3$ is more than 20 mol % and the amount of $TiO_2$ is less than 10 mol %, this is unfavorable since other phases different from $BaCO_3$ may be formed and the resistivity at room temperature may thereby increase. The other case where the amount of $TiO_2$ is more than 20 mol % and the amount of $BaCO_3$ is less than 10 mol % is also unfavorable for the same reason. Accordingly, when any one of the amount of $BaCO_3$ or the amount of $TiO_2$ is more than 20 mol %, the other is preferably at least 10 mol %.

As so mentioned in the above, formation of a complete single phase of $(BaR)TiO_3$ or $Ba(TiM)O_3$ as the calcined BT powder is preferred; however, even in a calcined BT powder where unreacted $BaCO_3$ and/or $TiO_2$ remains, the content of $BaCO_3$ and/or $TiO_2$ in the composition may be controlled by changing the calcination temperature. Accordingly, the calcined BT powder having a complete single phase formed therein may be partly substituted with a calcined BT powder with unreacted $BaCO_3$ and/or $TiO_2$ remaining therein, and a predetermined amount of $BaCO_3$ and/or $TiO_2$ may be further added thereto to change the amount thereof to be added.

For obtaining the semiconductor ceramic composition, a calcined BT powder and a calcined BNT powder are separately prepared, and $BaCO_3$ and/or $TiO_2$ is added to the calcined BT powder or the calcined BNT powder or to both the two, as so mentioned in the above. Next, the calcined powders were blended in a predetermined ratio, and then mixed. The powders may be mixed in wet using pure water or ethanol, or in dry. However, dry mixing is preferred as capable of restraining compositional deviation. Depending on the grain size of the calcined powders, the powder may be crushed after mixing or during mixing. After mixed and crushed, the mean grain size of the mixed calcined powder is preferably from 0.5 µm to 2.5 µm.

In the step of preparing the calcined BT powder and/or the step of preparing the BNT powder, or in the step of mixing the calcined powders, adding at most 3.0 mol % of Si oxide and at most 4.0 mol % of Ca oxide or Ca carbonate is favorable because Si oxide may prevent the abnormal growth of crystal grains and may readily control the resistivity, and Ca oxide or Ca carbonate may enhance the sinterability of the composition at low temperatures and may control the reducibility thereof. However, when either one of them is added in an amount exceeding the above-mentioned limit, then it is unfavorable since the composition cannot be semiconductive. Preferably, the addition is attained before mixing in each step.

The mixed calcined powder obtained in the step of mixing the calcined BT powder and the calcined BNT powder to prepare a mixed calcined powder may be formed by any desired forming means. Before forming, the crushed powder may be granulated with a granulator. The density of the compact after the forming is preferably from 2.5 to 3.5 g/m³.

The sintering may be attained in air or in a reducing atmosphere, or in an inert gas atmosphere having a low oxygen concentration, but preferably in a nitrogen or argon atmosphere having an oxygen concentration of less than 1%. The sintering temperature is preferably from 1250° C. to 1350° C. The sintering time is preferably from 1 hour to 10 hours, more preferably from 2 hours to 6 hours. With overstepping more from the preferred conditions, the resistivity at room temperature increases and the jump characteristic thereof becomes poor, unfavorably.

Another example of the sintering step is such that, at a temperature of 1290° C. to 1350° C. and in an atmosphere of less than 1% of an oxygen concentration, (1) sintering is performed in a sintering time of less than 4 hours or (2) sintering is performed in a sintering time satisfying an expression: $\Delta T \geq 25t$ (wherein t is sintering time (hr), and $\Delta T$ is cooling rate (° C./hr) after sintering), followed by cooling after sintering at a cooling rate satisfying the above expression. According to these sintering steps, it is possible to obtain a semiconductor ceramic composition that is improved in temperature coefficient of resistance at a high temperature region (higher than the Curie temperature) while maintaining low room temperature resistivity.

EXAMPLES

Example 1

Starting material powders of $BaCO_3$, $TiO_2$ and $La_2O_3$ were prepared and blended so as to be $(Ba_{0.994}La_{0.006})TiO_3$, followed by mixing in distilled water. The obtained mixed material powder was calcined at 500° C. to 1300° C. for 4 hours in air to prepare a calcined powder of $(BaLa)TiO_3$. FIG. 1 shows the X-ray diffraction patterns of the calcined powder of $(BaLa)TiO_3$ at different calcination temperatures of from 500° C. to 1200° C. No temperature expression is given to the X-ray diffraction pattern of the lowermost graph, but this pattern is at 500° C.

As is obvious from FIG. 1, it is shown that the (BaLa)TiO$_3$ powder calcined at 1000° C. or higher had neither BaCO$_3$ nor TiO$_2$ remaining therein, but had a completely single phase of (BaLa)TiO$_3$ formed therein.

Starting material powders of Na$_2$CO$_3$, Bi$_2$O$_3$ and TiO$_2$ were prepared and blended so as to be (Bi$_{0.5}$Na$_{0.5}$)TiO$_3$, followed by mixing in ethanol. The obtained mixed material powder was calcined at 800° C. for 2 hours in air to prepare a calcined powder of (BiNa)TiO$_3$.

Of the calcined powders of (BaLa)TiO$_3$ prepared previously, one having a complete single phase of (BaLa)TiO$_3$ calcined at 1000° C., 1100° C. or 1200° C. was blended with the calcined powder of(BiNa)TiO$_3$ in a ratio by mol of 73/7, and then an BaCO$_3$ powder and a TiO$_2$ powder were added thereto each in the amount indicated in Table 1. Using pure water as a medium, these were mixed and crushed in a pot mill to give a mixed calcined powder having a center grain size of from 1.0 μm to 2.0 μm, and then dried. PVA was added to the crushed powder of the mixed calcined powder, followed by mixing, and the mixture was granulated with a granulator. The granulated powder thus obtained was formed with a uniaxial pressing machine, the compact was processed for binder removal at 700° C., and then sintered in air at a sintering temperature of 1290° C., 1320° C. or 1350° C. for 4 hours to give a sintered body.

A test piece was obtained by processing the obtained sintered body into a plate having a size of 10 mm×10 mm×1 mm, with which an ohmic electrode was formed. The test piece was tested with a resistance meter to determine its resistivity change in a temperature range of from room temperature to 270° C. The measurement results are shown in Table 1. The samples numbered with * are comparative example or undesirable examples. In all Examples, the temperature coefficient of resistance was computed according to the following formula: $\alpha=(\ln R_1 - \ln R_c) \times 100/(T_1 - T_c)$ wherein $R_1$ means the maximum resistivity; $R_c$ means the resistivity at $T_c$; $T_1$ means the temperature at which the composition has $R_1$; and $T_c$ means the Curie temperature.

As is obvious from the measurement results in Table 1, the [(BiNa)$_x$(Ba$_{1-y}$R$_y$)$_{1-x}$]TiO$_3$ semiconductor ceramic composition of the invention, as produced by using the (BaLa)TiO$_3$ powder calcined at 1000° C. or higher, adding BaCO$_3$ powder and/or TiO$_2$ powder to the mixed calcined powder of the calcined powder of (BaLa)TiO$_3$ and the calcined powder of (BiNa)TiO$_3$, followed by mixing, crushing, forming and sintering, had a high jump characteristic and its resistivity at room temperature was prevented from increasing.

On the other hand, in Sample No. 16 as a comparative example, since the content of the BaCO$_3$ powder and the TiO$_2$ powder was too large, and different phases were considered to be formed, the resistivity at room temperature greatly increased. In Sample No. 21 and No. 26 as unfavorable examples, since one of the amount of BaCO$_3$ or the amount TiO$_2$ was more than 20 mol % and the other was less than 10 mol %, the resistivity at room temperature of the compositions increased.

Example 2

Starting material powders of BaCO$_3$, TiO$_2$ and Nb$_2$O$_5$ were prepared and blended so as to be Ba(Ti$_{0.998}$N$_{0.002}$)O$_3$, followed by mixing in pure water. The obtained mixed material powder was calcined at 1000° C. for 4 hours in air to prepare a calcined powder of Ba(TiNb)O$_3$.

Starting material powders of Na$_2$CO$_3$, Bi$_2$O$_3$ and TiO$_2$ were prepared and blended so as to be (Bi$_{0.5}$Na$_{0.5}$)TiO$_3$, followed by mixing in ethanol. The obtained mixed material powder was calcined at 800° C. for 2 hours in air to prepare a calcined powder of (BiNa)TiO$_3$.

The calcined powder of Ba(TiNb)O$_3$ and the calcined powder of (BiNa)TiO$_3$ thus prepared were blended in a ratio by mol of 73/7, and then BaCO$_3$ powder and TiO$_2$ powder were added thereto each in the amount indicated in Table 2. Using pure water as a medium, these were mixed and crushed in a pot mill to give a mixed calcined powder having a center grain size of from 1.0 μm to 2.0 μm, and then dried. PVA was added to the crushed powder of the mixed calcined powder, followed by mixing, and the mixture was granulated with a granulator. The granulated powder thus obtained was formed with a uniaxial pressing machine, the compact was processed for binder removal at 700° C., and then sintered in air at a sintering temperature of 1320° C. for 4 hours to give a sintered body. The obtained sintered body was tested according to the same method as in Example 1 to determine the temperature-dependent change in the resistivity thereof. The measurement results are shown in Table 2.

As is obvious from the measurement results in Table 2, the [(BiNa)$_x$Ba$_{1-x}$][Ti$_{1-z}$M$_z$]O$_3$ semiconductor ceramic composition of the invention, as produced by adding BaCO$_3$ powder and/or TiO$_2$ powder to the mixed calcined powder of the calcined powder of Ba(TiNb)O$_3$ and the calcined powder of (BiNa)TiO$_3$, followed by mixing, crushing, forming and sintering, had a high jump characteristic and its resistivity at room temperature was prevented from increasing, like the [(BiNa)$_x$(Ba$_{1-y}$R$_y$)$_{1-x}$]TiO$_3$ semiconductor ceramic composition in Example 1.

TABLE 1

| Sample No. | (BaLa)TiO$_3$ Calcination Temperature (° C.) | Amount of BaCO$_3$ added (mol %) | Amount of TiO$_2$ added (mol %) | Sintering Temperature (° C.) | ρ30 (Ωcm) | Tc (° C.) | Temperature Coefficient of Resistance (%/° C.) |
|---|---|---|---|---|---|---|---|
| 1 | 1000 | 2.5 | 2.5 | 1290 | 82.1 | 161.1 | 20.2 |
| 2 | 1100 | | | | 96.2 | 157.4 | 24.1 |
| 3 | 1200 | | | | 90.5 | 159.5 | 23.8 |
| 4 | 1000 | 2.5 | 2.5 | 1320 | 77.2 | 159.3 | 24.2 |
| 5 | 1100 | | | | 68.4 | 158.8 | 23.5 |
| 6 | 1200 | | | | 66.5 | 159.3 | 23.3 |
| 7 | 1000 | 2.5 | 2.5 | 1350 | 76.2 | 160.4 | 23.8 |
| 8 | 1100 | | | | 76.9 | 160.0 | 22.9 |
| 9 | 1200 | | | | 72.9 | 161.1 | 22.8 |
| 10 | 1000 | 1 | 1 | 1320 | 62.1 | 159.2 | 23.4 |
| 11 | | 4 | 4 | | 67.1 | 157.3 | 22.8 |
| 12 | | 8 | 8 | | 82.1 | 156.8 | 20.7 |
| 13 | | 10 | 10 | | 88.8 | 158.1 | 20.1 |

TABLE 1-continued

| Sample No. | (BaLa)TiO$_3$ Calcination Temperature (° C.) | Amount of BaCO$_3$ added (mol %) | Amount of TiO$_2$ added (mol %) | Sintering Temperature (° C.) | ρ30 (Ωcm) | Tc (° C.) | Temperature Coefficient of Resistance (%/° C.) |
|---|---|---|---|---|---|---|---|
| 14 |  | 20 | 20 |  | 94.2 | 160.7 | 20.4 |
| 15 |  | 30 | 30 |  | 189.3 | 160.2 | 19.6 |
| 16* |  | 40 | 40 |  | 340.5 | 146.9 | 24.9 |
| 17 | 1000 | 2.5 | 1 | 1320 | 90.2 | 162.1 | 20.3 |
| 18 |  |  | 4 |  | 93.8 | 157.4 | 21.3 |
| 19 |  |  | 5 |  | 98.9 | 160.8 | 19.7 |
| 20 |  | 10 | 20 |  | 88.6 | 158.8 | 19.8 |
| 21* |  | 20 | 20 |  | 108.6 | 159.8 | 17.8 |
| 22 | 1000 | 1 | 2.5 |  | 89.7 | 157.4 | 18.2 |
| 23 |  | 4 |  |  | 92.2 | 156.2 | 19.2 |
| 24 |  | 5 |  |  | 96.6 | 149.7 | 20.2 |
| 25 |  | 20 | 10 |  | 99.9 | 148.3 | 19.7 |
| 26* |  | 20 | 12 |  | 121.3 | 148.9 | 17.2 |
| 27 | 1200 | 1 | 2.5 |  | 79.9 | 159.9 | 18.8 |
| 28 |  | 2.5 | 1 |  | 88.3 | 154.9 | 21.7 |
| 29 | 1000 | 5 | 0 |  | 102.2 | 151.1 | 17.0 |
| 30 | 1100 | 5 | 0 |  | 99.5 | 150.5 | 17.7 |
| 31 | 1000 | 0 | 5 |  | 108.2 | 158.1 | 18.2 |
| 32 | 1100 | 0 | 5 |  | 101.1 | 149.9 | 16.8 |

TABLE 2

| Sample No. | Ba(TiNb)O$_3$ Calcination Temperature (° C.) | Amount of BaCO$_3$ added (mol %) | Amount of TiO$_2$ added (mol %) | Sintering Temperature (° C.) | ρ25 (Ωcm) | Tc (° C.) | Temperature Coefficient of Resistance (%/° C.) |
|---|---|---|---|---|---|---|---|
| 33 | 1000 | 1 | 1 | 1320 | 68.2 | 161.1 | 21.9 |
| 34 |  | 2 | 2 |  | 79.2 | 156.1 | 20.7 |
| 35 |  | 4 | 4 |  | 74.1 | 157.3 | 22.8 |
| 36 |  | 5 | 5 |  | 94.9 | 153.7 | 19.2 |

While the invention has been described in detail and with reference to specific embodiments thereof, it will be apparent to one skilled in the art that various changes and modifications can be made therein without departing from the spirit and scope thereof.

INDUSTRIAL APPLICABILITY

The semiconductor ceramic composition obtained according to the invention is optimal as a material for a PTC thermistor, a PTC heater, a PTC switch, a temperature detector, and the like.

The invention claimed is:

1. A BaTiO$_3$ semiconductor ceramic composition in which a part of the Ba is substituted with Bi—Na, the semiconductor ceramic composition being represented by a composition formula: [(BiNa)$_x$(Ba$_{1-y}$R$_y$)$_{1-x}$]TiO$_3$, wherein R is at least one rare earth element and x and y each satisfy 0<x≦0.3 and 0<y≦0.02,
wherein the semiconductor ceramic composition is obtained by sintering a mixed calcined powder comprising a calcined powder of (BaR)TiO$_3$, wherein R is at least one rare earth element), and a calcined powder of (BiNa)TiO$_3$; and
wherein BaCO$_3$ and/or TiO$_2$ is/are added to the calcined BT powder or the calcined BNT powder or to the mixed calcined powder, and the amount of BaCO$_3$ and/or TiO$_2$ added is such that the amount of BaCO$_3$ is at most 30 mol % and the amount TiO$_2$ is at most 30 mol % when the total amount of the calcined BT powder and BaCO$_3$ and/or TiO$_2$ is taken as 100 mol %.

2. A method for producing a BaTiO$_3$ semiconductor ceramic composition in which a part of the Ba is substituted with Bi—Na, in which the semiconductor ceramic composition is represented by a composition formula: [(BiNa)$_x$(Ba$_{1-y}$R$_y$)$_{1-x}$]TiO$_3$, wherein R is at least one rare earth element and wherein x and y each satisfy 0<x≦0.3 and 0<y≦0.02,
wherein the method comprises:
a step of preparing a calcined powder of (BaR)TiO$_3$, wherein R is at least one rare earth element at a calcination temperature of not lower than 1000° C.,
a step of preparing a calcined powder of (BiNa)TiO$_3$ at a calcination temperature within the range of 700° C. to 950° C.,
a step of mixing the calcined (BaR)TiO$_3$ powder and the calcined (BiNa)TiO$_3$ powder to prepare a mixed calcined powder,
and a step of forming and sintering the mixed calcined powder;
wherein BaCO$_3$ and/or TiO$_2$ is/are added to the calcined (BaR)TiO$_3$ powder or the calcined (BiNa)TiO$_3$ powder or to the mixed calcined powder, and the amount of BaCO$_3$ and/or TiO$_2$ added is such that the amount of BaCO$_3$ is at most 30 mol % and the amount of TiO$_2$ is at most 30 mol % when the total amount of the calcined BT powder and BaCO$_3$ and/or TiO$_2$ is taken as 100 mol %.

3. The method for producing a semiconductor ceramic composition as claimed in claim 2, wherein 3.0 mol % or less of Si oxide and 4.0 mol % or less of Ca carbonate or Ca oxide are added before the step of preparing the calcined $(BaR)TiO_3$ powder or the step of preparing the calcined $(BiNa)TiO_3$ powder or both of the two steps.

4. The method for producing a semiconductor ceramic composition as claimed in claim 2, wherein 3.0 mol % or less of Si oxide and 4.0 mol % or less of Ca carbonate or Ca oxide are added in the step of mixing the calcined $(BaR)TiO_3$ powder and the calcined $(BiNa)TiO_3$ powder to prepare the mixed calcined powder.

5. The semiconductor ceramic composition as claimed in claim 1, wherein one of the amount of $BaCO_3$ and the amount of $TiO_2$ is more than 20 mol %, and the other amount is at least 10 mol %.

6. The method for producing a semiconductor ceramic composition as claimed in claim 2, wherein one of the amount of $BaCO_3$ and the amount of $TiO_2$ is more than 20 mol %, and the other amount is at least 10 mol %.

* * * * *